(12) United States Patent
Trifonov et al.

(10) Patent No.: US 7,501,970 B2
(45) Date of Patent: Mar. 10, 2009

(54) DIGITAL TO ANALOG CONVERTER ARCHITECTURE AND METHOD HAVING LOW SWITCH COUNT AND SMALL OUTPUT IMPEDANCE

(75) Inventors: Dimitar T. Trifonov, Vail, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/880,568

(22) Filed: Jul. 23, 2007

(65) Prior Publication Data
US 2008/0100489 A1    May 1, 2008

Related U.S. Application Data

(60) Provisional application No. 60/863,503, filed on Oct. 30, 2006.

(51) Int. Cl.
*H03M 1/66* (2006.01)
(52) U.S. Cl. ................. 341/145; 341/144; 341/154
(58) Field of Classification Search ................. 341/145, 341/154
See application file for complete search history.

(56) References Cited

U.S. PATENT DOCUMENTS

| | | | |
|---|---|---|---|
| 5,808,576 A | | 9/1998 | Chloupek et al. |
| 5,914,682 A | * | 6/1999 | Noguchi .................... 341/145 |
| 5,977,898 A | * | 11/1999 | Ling et al. ................... 341/144 |
| 6,268,817 B1 | * | 7/2001 | Min et al. .................... 341/145 |
| 6,384,763 B1 | * | 5/2002 | Leung et al. ................ 341/154 |
| 6,914,547 B1 | * | 7/2005 | Swaroop et al. ............. 341/144 |
| 7,277,036 B2 | * | 10/2007 | Otake ........................ 341/154 |

* cited by examiner

*Primary Examiner*—Khai M Nguyen
(74) *Attorney, Agent, or Firm*—Warren J. Franz; Frederick J. Telecky, Jr.; Wade J. Brady, III (57) ABSTRACT

A digital to analog converter includes a coarse resolution resistor circuit (11) coupled between a first voltage (Vin) and an intermediate voltage (V0) to produce coarse resolution node voltages (V0, ... V240), and also includes a fine resolution resistor circuit (20) coupled between the intermediate voltage and a second voltage (GND). One of the coarse resolution node voltages is selected in response to a group of MSB bits of a digital input (D0,1 ... ) to produce a first output voltage (Vout2), and one of the fine resolution node voltages is selected in response to group of LSB bits of the digital input to produce a second output voltage (Vout1), the second output voltage (Vout1) and the first output voltage (Vout2) providing a differential analog output signal (Vout1–Vout2). In one embodiment, the coarse resolution and fine resolution resistor circuits are string resistor circuits, and in another embodiment they are modified R-2R networks.

18 Claims, 3 Drawing Sheets

DIGITAL TO ANALOG CONVERTER ARCHITECTURE AND METHOD HAVING LOW SWITCH COUNT AND SMALL OUTPUT IMPEDANCE

CROSS REFERENCE TO RELATED APPLICATION

This application claims the benefit of prior filed U.S. provisional application Ser. No. 60/863,503 filed Oct. 30, 2006, entitled "DAC WITH REDUCED SWITCH COUNT AND A SMALL OUTPUT IMPEDANCE", by Dimitar T. Trifonov and Jerry L. Doorenbos, and incorporated herein by reference.

BACKGROUND OF THE INVENTION

The present invention relates generally to string DACs (digital to analog converters), and more particularly to string DAC architectures having a reduced number of resistors and switches, reduced output impedance, and reduced output impedance range.

Typically, an N-bit resistor string DAC includes $2^N$ resistors and from $2^N$ or more switches, depending on the complexity of the decoder. Thus, a 10-bit string resistor DAC would include 1024 resistors and at least 1024 switches which require a large amount of integrated circuit area. A large amount of digital decode circuitry for controlling the large number of switches also is required. The integrated circuit chip area increases rapidly with the number of bits. Furthermore, the string resistor DAC speed is reduced by parasitic capacitances associated with the large number of switches.

There are various references that deal with ways to reduce the number of switches in a string DAC. A reference representative of the closest prior art is believed to be commonly owned U.S. Pat. No. 5,808,576 "Resistor-String Digital-to-Analog Converter" issued Sep. 15, 1998 to Chloupek et al. This patent discloses a digital to analog converter including a first array of resistors connected in series, a switch matrix coupled to the first array, a first variable resistor coupled to a first end of the first array of resistors, and a second variable resistor coupled to a second end of the first array of resistors. The first variable resistor and the second variable resistor have a combined resistance that has a fixed value.

Figure 1:
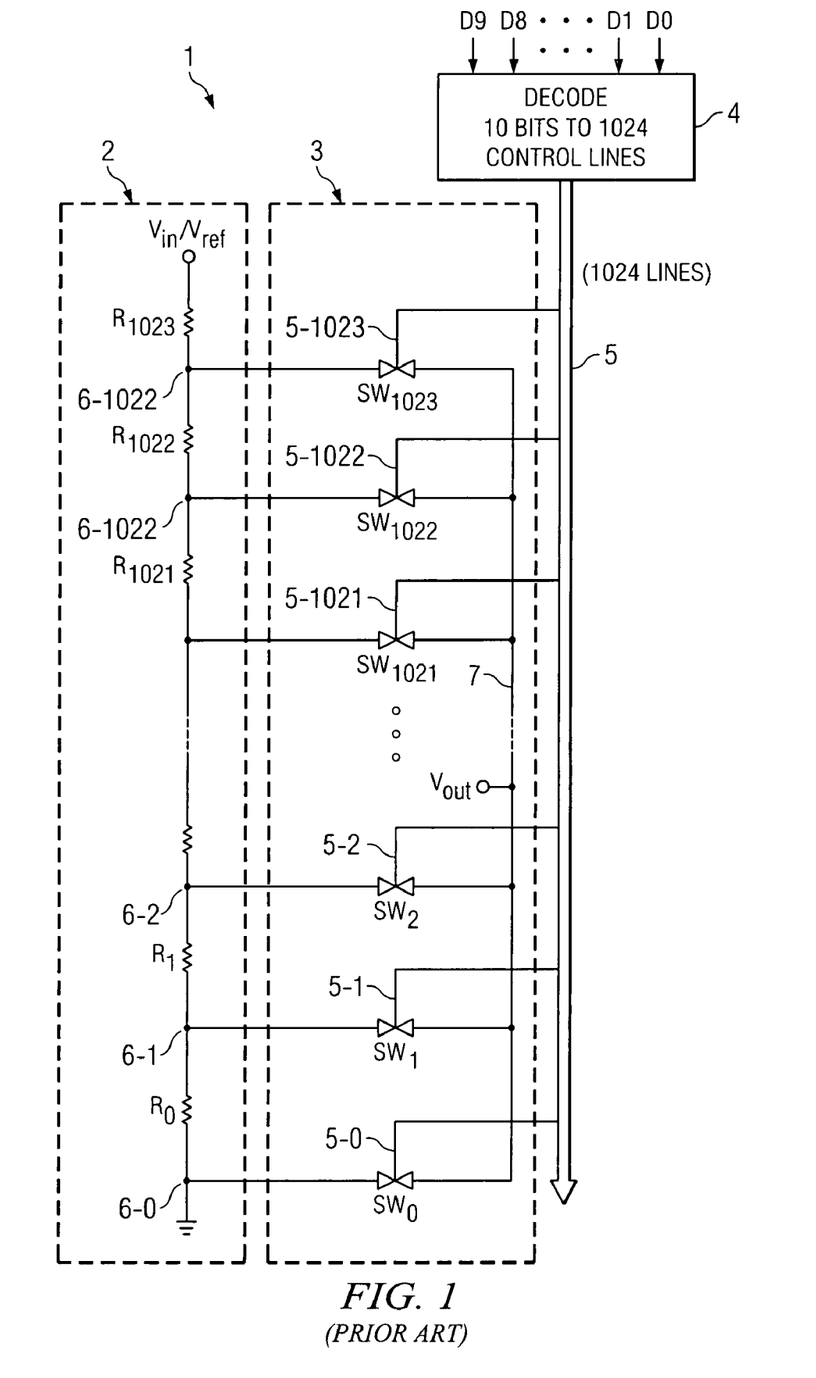
FIG. 1 is a schematic diagram of a conventional 10-bit string DAC.

FIG. 1 shows a typical 10-bit string DAC 1 including a resistor string 2 having 1024 series-connected identical resistors R0,1 . . . 1023, 1024 switches SW0,1 . . . 1023, and a digital decoder 4 which decodes the 10 digital inputs D0,1 . . . 9. Decoder 4 produces signals on control lines 5-0,1 . . . 1023 which are connected to control terminals of switches SW0,1 . . . 1023 to select one of the 1024 node voltages on conductors 6-0,1,2 . . . 1023. One terminal of each of switches SW0,1 . . . 1023 is connected to one of conductors 6-0,1, . . . 1023, respectively, and the other terminal of each of switches SW0,1 . . . 1023 is connected to conductor 7, on which Vout is produced. Switches SW0,1 . . . 1023 can be N-channel transistors, or they can be CMOS transmission gates, in which case each of the control lines 5-0,1 . . . 1023 includes two conductors conducting logical complement control signals to the N-channel transistor and the P-channel transistor, respectively, which comprise each transmission gate.

For use in conjunction with switched capacitor circuits, it is desirable that a DAC having a differential output signal present the same output impedance on both output conductors. The terminal to which Vin is applied and the terminal which in FIG. 1 is illustrated as being a ground conductor can be differential input terminals of DAC 1. For example, a differential input voltage Vin=Vin+−Vin− can be applied to DAC 1 wherein Vin+ is applied to the upper terminal of resistor $R_{1023}$ and input signal Vin− is applied to conductor 6-0.

A drawback of string DAC 1 of FIG. 1 is that it requires such large numbers of switches and series-connected string resistors, i.e., 1024 switches and 1024 resistive segments or string resistors. Furthermore, an undesirably large amount of digital decode circuitry is required. Therefore, the amount of required integrated circuit area is relatively large, resulting in high integrated circuit cost for string resistor DAC 1. Another drawback of conventional string resistor DAC 1 is that it has a large magnitude output impedance, the value of which varies over a wide range with respect to the DAC input code D0,1 . . . 9. This is a serious problem in many applications, because that causes settling times of associated switched capacitor circuits to also be dependent on the DAC input code.

Thus, there is an unmet need for a string resistor DAC having a substantially reduced number of resistors and switches.

There also is an unmet need for a string resistor DAC having reduced output impedance.

There also is an unmet need for a string resistor DAC having a reduced output impedance range.

There also is an unmet need for a string resistor DAC in which the output impedance is relatively invariant with respect to the value of the digital input number.

There also is an unmet need for a string resistor DAC which provides relatively consistent settling times for voltages on sampling capacitors which sample the output of the string resistor DAC.

SUMMARY OF THE INVENTION

It is an object of the invention to provide a DAC which is based on a string resistor architecture and which requires only a substantially reduced number of resistors and switches compared to the closest prior art.

It is another object of the invention to provide a DAC which is based on a string resistor architecture and which has substantially reduced output impedance and also a substantially reduced output impedance range compared to the closest prior art.

It is another object of the invention to provide a string resistor DAC having a reduced output impedance range.

It is another object of the invention to provide a string resistor DAC in which the output impedance is relatively invariant with respect to the value of the digital input number.

It is another object of the invention to provide a string resistor DAC which provides relatively consistent settling times for voltages on sampling capacitors which sample the output of the string resistor DAC.

It is another object of the invention to provide a differential output string resistor DAC having relatively constant output impedance on both output conductors to provide relatively consistent settling times of switched capacitor circuits coupled to the output conductors.

Briefly described, and in accordance with one embodiment, the present invention provides a digital to analog converter which includes a coarse resolution resistor circuit (11) coupled between a first voltage (e.g., V992, V240 or Vin−) and an intermediate voltage (V0) to produce coarse resolution node voltages (V0, . . . V240,V992), and which also includes a fine resolution resistor circuit (20) coupled between the intermediate voltage and a second voltage (e.g., GND or Vin−). One of the coarse resolution node voltages is selected in response to a group of MSB bits of a digital input (D0,1 . . . ) to produce a first output voltage (Vout2), and one of the fine resolution node voltages is selected in response to group of LSB bits of the digital input to produce a second output voltage (Vout1), the second output voltage (Vout1) and the first output voltage (Vout2) providing a differential analog output signal (Vout1−Vout2). In one embodiment, the coarse resolution and fine resolution resistor circuits are string resistor circuits, and in another embodiment they are modified R-2R networks.

In one embodiment, the invention provides a n-bit digital to analog converter for converting a digital input number (D0, 1 . . . (n−1)) to an analog output signal (Vout1−Vout 2), including a coarse resolution resistor circuit (11) coupled between a first input voltage (Vin/Vref) and an intermediate voltage (V0) for producing a first number of coarse resolution node voltages (V0, . . . (V240)). Each coarse resolution node voltage is separated from an adjacent coarse resolution node voltage by a first input voltage increment equal to the difference between the first input voltage (Vin/Vref) and the intermediate voltage (V0) divided by the first number minus 1. A first switching circuit (12) includes the first number of switches (SW2) each having a first terminal coupled to a corresponding coarse resolution node voltage, respectively, and each having a second terminal coupled to a first output conductor (16). A coarse resolution decoder (14) for decoding a second number of most significant bits of the input number (D0, 1 . . . (n−1)) produces switch selection signals applied to control terminals (15-0, 1 . . . (31 or 15)) of the switches (SW2) of the first switching circuit (12), respectively. A fine resolution resistor circuit (20) is coupled between the intermediate voltage (V0) and a second input voltage (GND or Vin) for producing a third number of fine resolution node voltages (V0, 1 . . . (V15 or V31)), each fine resolution node voltage being separated from an adjacent fine resolution node voltage by a second voltage increment equal to the difference between the intermediate voltage (V0) and the second input voltage (GND or Vin−) divided by the third number. A second switching circuit (20) includes the third number of switches (SW1) each having a first terminal coupled to a corresponding fine resolution node voltage, respectively, and each having a second terminal coupled to a second output conductor (26). A fine resolution decoder (23) for decoding a fourth number of least significant bits of the input number (D 0, 1 . . . (n−1)) produces and applies switch selection signals to control terminals (24-0, 1 . . . (31 or 15)) of the switches (SW1) of the second switching circuit (21), respectively. An analog output signal (Vout2 −Vout1) is thereby produced between the second (26) and first (16) output conductors. In a described embodiment, the first number and the third number are equal.

In one embodiment, the coarse resolution resistor circuit (11) includes a first string resistor circuit including the first number minus 1 of resistors (R2-1,2 . . . 31) connected in series between the first input voltage (Vin/Vref or V240) and the intermediate voltage (V0), and the fine resolution resistor circuit (20) includes a second string resistor circuit including the third number of resistors (R1-0,1,2 . . . 31) connected in series between the intermediate voltage (V0) and the second input voltage (GND or Vin−).

In one embodiment, the coarse resolution resistor circuit (30-2A) includes a plurality of sequentially connected R-2R sections (53,52,51,50) all composed of identical resistive links each having a predetermined resistance (R). Each R-2R section includes a R section and a 2R section. The first number of coarse resolution node voltages are produced on various terminals of resistive links in the R sections of the coarse resolution resistor circuit (30-2A). A first R section (R41) and a first R-2R section (53) produce one of the coarse resolution node voltages, and successive adjacent R sections (52,51,50) each produce twice as many of the coarse resolution node voltages as the previous R section, respectively. In one embodiment, the fine resolution resistor circuit (30-2B) includes a plurality of sequentially connected R-2R sections all composed of identical resistive links each having the predetermined resistance (R) and a termination circuit (57) including a R section (R2). Each R-2R section of the fine resolution resistor circuit (30-2B) includes a R section and a 2R section, wherein the R section (R2) of the termination circuit (57) is composed of one resistive link, the third number of fine resolution voltage nodes are produced on various terminals of the resistive links in the fine resolution resistor circuit (30-2B). The R section (R2) of the termination circuit (57) produces one of the fine resolution node voltages. Each of the successive adjacent R sections (56,55,54) of the fine resolution resistor circuit (30-2B) produces twice as many of the fine resolution node voltages as the previous R section, respectively. Each successive adjacent R section of the fine resolution resistor circuit (30-2A) also can include additional resistive links arranged so as to cause the resistance of that R section to be equal to the predetermined resistance.

In some of the R-2R sections, none of the additional resistive links in any R section is connected directly to any of the fine resolution node voltages produced between the terminals of that R section. In some of the R-2R sections, one of the additional resistive links in a R section is connected to a fine resolution node voltage produced between the terminals of that R section.

In a described embodiment, the first voltage increment is equal to $2^{n/2}$ times the second voltage increment.

In a described embodiment, the coarse resolution resistor circuit (11) is coupled between the first input voltage (V240) and a higher magnitude reference voltage (Vin/vref) by means of a scaling resistance (30-1) to produce the first input voltage (V240) as a precisely scaled version of the higher magnitude reference voltage.

In one embodiment, the invention provides a method for converting a digital input number (D0,1 . . . (n−1)) to an analog output signal (Vout1−Vout2), including coupling a coarse resolution resistor circuit (11) between a first input voltage (Vin/Vref or V240 or V992) and an intermediate voltage (V0) to produce a first number of coarse resolution node voltages (V0, . . . (V240 or V992)), each coarse resolution node voltage being separated from an adjacent coarse resolution node voltage by a first voltage increment equal to the difference between the first input voltage (Vin/Vref or V240 or V992) and the intermediate voltage (V0) divided by the first number minus 1, and also coupling a fine resolution resistor circuit (20) between the intermediate voltage (V0) and a second input voltage (GND or Vin−) for producing a second number of fine resolution node voltages (V0,1 . . . (V15 or V31)), each fine resolution node voltage being separated from an adjacent fine resolution node voltage by a second voltage increment equal to the difference between the intermediate voltage (V0) and the second input voltage (GND or Vin−) divided by the second number and selecting one of the coarse resolution node voltages in response to a third number of most significant bits of the digital input number (D0,1 . . . (n−1)) to produce a first output voltage (Vout2) and selecting one of the fine resolution node voltages in response to a fourth number of least significant bits of the digital input number (D0,1 . . . (n−1)) to produce a second output voltage (Vout1), the second output voltage (Vout1) and the first output voltage (Vout2) providing the analog output signal (Vout1−Vout2). In a described embodiment, the method includes setting the first voltage increment equal to $2^{n/2}$ times the second voltage increment and setting the magnitude of the intermediate voltage (V0) equal to the first voltage increment.

In a described embodiment, the invention provides a digital to analog converter for converting a digital input number (D0,1 ... (n−1)) to an analog output signal (Vout1−Vout2), including a coarse resolution resistor circuit (11) coupled between a first input voltage (Vin/Vref or V240 or Vin+) and an intermediate voltage (V0) to produce a first number of coarse resolution node voltages (V0, ... (V240 or V992)), each coarse resolution node voltage being separated from an adjacent coarse resolution node voltage by a first voltage increment equal to the difference between the first input voltage (Vin/Vref or V240 or Vin+) and the intermediate voltage (V0) divided by the first number minus 1, a fine resolution resistor circuit (20) coupled between the intermediate voltage (V0) and a second input voltage (GND or Vin−) for producing a second number of fine resolution node voltages (V0,1 ... (V15 or V31)), each fine resolution node voltage being separated from an adjacent fine resolution node voltage by a second voltage increment equal to the difference between the intermediate voltage (V0) and a second input voltage (GND or Vin−) divided by the second number, means (35B) for selecting one of the coarse resolution node voltages in response to a third number of most significant bits of the digital input number (D0,1 ... (n−1)) to produce a first output voltage (Vout2), and means (35A) for selecting one of the fine resolution node voltages in response to a fourth number of least significant bits of the digital input number (D0,1 ... (n−1)) to produce a second output voltage (Vout1), the second output voltage (Vout1) and the first output voltage (Vout2) providing a differential analog output signal (Vout1−Vout2).

DETAILED DESCRIPTION OF THE PREFERRED EMBODIMENTS

Figure 2:
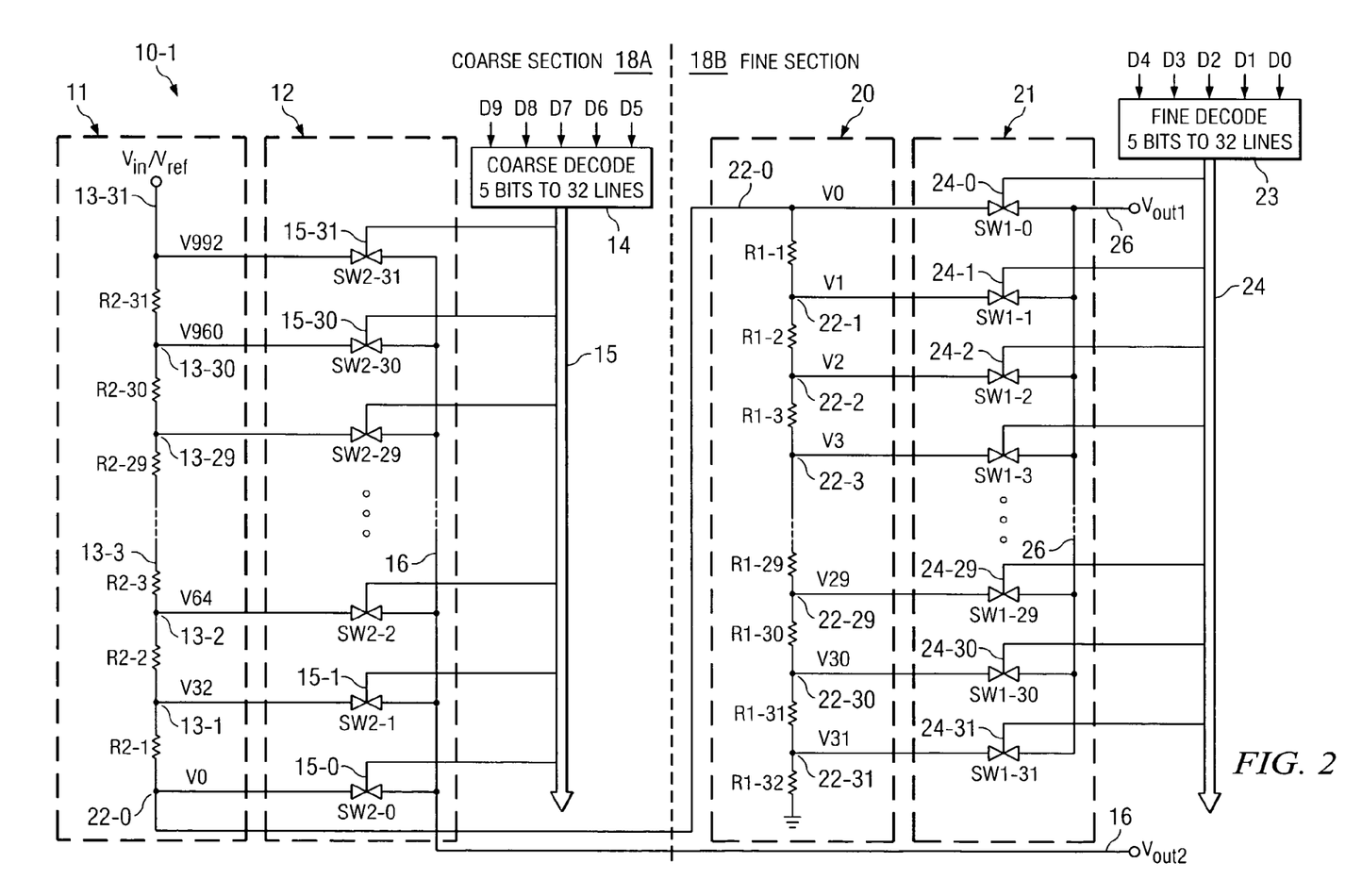
FIG. 2 is a schematic diagram illustrating a DAC architecture of the present invention.

FIG. 2 shows a 10-bit DAC that reduces the number of switches from the 1024 switches shown in FIG. 1 to only 64 switches. 10-bit DAC 10-1 includes a 5-bit "coarse resolution" section 18A, and also includes a 5-bit "fine resolution" section 18B. Coarse resolution section 18A includes a coarse resolution string resistor section 11, a switch section 12, and a 5-bit coarse resolution decoder 14 which decodes the 5 most significant bits D5,6 ... 9 of the 10-bit input word D0,1,2 ... 9. Fine resolution section 18B includes a fine resolution string resistor section 20, a switch section 21, and a fine resolution decoder 23 which decodes the 5 least significant bits D0,1 ... 4 of the 10-bit input word D0,1,2 ... 9.

Coarse resolution string resistor section 11 includes 31 series-connected resistors R2-1,2 ... 31, each of which has a resistance equal to 32×R. Note that fine resolution section 18B functions as a 32nd resistor having the same resistance as each of the resistors in coarse resolution section 18A. Resistor R2-1 has its lower terminal connected to conductor 22-1 and its upper terminal connected by conductor 13-1 to the lower conductor of resistor R2-2. Conductors 13-2,3 ... 30 are connected to the junctions between resistors R2-2 and R2-3, between resistors R2-3 and R2-4, and so on. Conductor 13-31 is connected to the upper terminal of resistor R2-31 and also is connected to a voltage input terminal to which an input voltage Vin or a reference voltage Vref is applied. Node voltages V0, V32, V64 ... V960, and V992 are produced on conductors 22-1, 13-1, 13-2 ... , 13-30, and 13-31, respectively.

Switch section 12 includes 32 switches SW2-0,1 ... 31. The left and right terminals of switch SW2-0 are connected to conductors 22-0 and 16, respectively. The left terminals of switches SW2-1,2 ... 31 are connected to conductors 13-1,2 ... 31, respectively. The right terminals of switches SW2-1,2 ... 31 are connected to conductor 16, on which an output signal Vout2 is produced. 32 output control lines 15-0, 1,2 ... 31 from coarse resolution decoder 14 are connected to the control terminals of switches SW2-0,1 ... 31, respectively. Switches SW2-0,1 ... 31 can be N-channel transistors, or they can be CMOS transmission gates, in which case each of the control lines 15-0,1 ... 31 includes two conductors conducting logical complement control signals to the N-channel transistor and the P-channel transistor, respectively, which comprise each transmission gate.

Fine resolution string resistor section 20 includes 32 series-connected resistors R1-1,2 ... 32 each of which has a resistance equal to R. Resistor R1-1 has its upper terminal connected to conductor 22-0 and its lower terminal connected by conductor 22-1 to the upper conductor of resistor R1-2. Conductors 22-1,2 ... 31 are connected to the junctions between resistors R1-1 and R1-2, between resistors R1-2 and R1-3, and so on. The lower terminal of resistor R1-32 is connected to ground. Node voltages V0, V1, V2 ... V31 are produced on conductors 22-0, 22-1, 22-2 ... 22-31, respectively.

Switch section 21 includes 32 switches SW1-0,1 ... 31. The left and right terminals of switch SW1-0 are connected to conductors 22-0 and 26, respectively. The left terminals of switches SW1-0,1,2 ... 31 are connected to conductors 22-0,1,2 ... 31, respectively. The right terminals of switches SW1-0,1,2 ... 31 are connected to conductor 26, on which an output signal Vout2 is produced. The 32 output control lines 24-0,1,2 ... 31 from fine resolution decoder 23 are connected to the control terminals of switches SW1-0,1 ... 31, respectively. The differential output voltage produced by DAC 10-1 is Vout2−Vout1.

Switches SW1-0,1 ... 31 can be N-channel transistors, or they can be CMOS transmission gates, in which case each of the control lines 24-0,1 ... 31 includes two conductors conducting logical complement control signals to the N-channel transistor and the P-channel transistor, respectively, which comprise each transmission gate.

Coarse resolution decode circuit 14 is the MSB decoder, and receives the most significant digital input bits D5,6 ... 9, and fine resolution decode circuit 23 is the LSB decoder, which receives the least significant digital input bits D0,1 ... 4. Coarse resolution circuitry 18A is referenced to either Vin or Vref on conductor 13-31, and fine resolution circuitry 18B is referenced to ground. (Alternatively, a differential input voltage Vin=Vin+−Vin− can be applied to DAC 10-1 wherein Vin+ is applied to conductor 13-31 and input signal Vin− is applied to the conductor, labeled as ground in the drawings, which is connected to the bottom terminal of resistor R1-32.) The input voltage on conductor 13-31 can be can be either a time-varying input signal Vin or a reference voltage Vref. DAC 10-1 can be used as a controllable voltage divider wherein the differential output signal Vout2−Vout1 is proportional to Vin or Vref, depending on the value of the digital input word D0,1,2 ... 9. Thus, DAC 10-1 can be used as a digitally controllable reference voltage source to scale down a fixed reference voltage supplied by another reference voltage circuit, or as a digitally controllable signal source to scale down a signal voltage.

It should be understood that fine resolution section 18B is illustrated as being, in effect, a 32nd resistor which is connected in series with coarse resolution section 18A, and although in FIG. 2 fine resolution section 18B is connected between the ground or lower differential input terminal of DAC 10-1 in the bottom of coarse resolution section 18A, the relative positions of fine section 18B and coarse resolution section 18A could be reversed. (Note, however, that fine resolution section 18B could actually be swapped with any one of the coarse resolution resistors R2-1,2 . . . 31.)

The coarse resolution voltage steps between the voltage nodes 13-1, 13-2 . . . etc. in the coarse resolution resistor string 11 are 32 times larger than the fine resolution voltage steps between the voltage nodes 22-1, 22-2 . . . etc. in fine resolution resistor string 20. In operation, a selected number of voltage steps in fine resolution resistor string 20 (wherein the number of such voltage steps is determined by fine resolution decoder 23 in response to least significant bits D0,1 . . . 4) is added to a selected number of voltage steps in coarse resolution resistor string 11 (wherein the number of such voltage steps is determined by a coarse resolution decoder 14 in response to the most significant bits D5,6 . . . 9). For example, a particular selected number of 32-millivolt coarse voltage steps of coarse resistor string 11 may be added to another selected number of 1-millivolt fine voltage steps of fine resistor string 20 to provide a value of differential output voltage Vout2−Vout1 with a resolution of 1 millivolt.

DAC 10-1 of FIG. 2 has the advantage of greatly reducing both the number of switches and the amount of decode logic required and also greatly reduces the overall circuit complexity. DAC 10-1 of FIG. 2 has only $2^{(1+n/2)}$ switches and string resistors, although the coarse resolution resistors have much greater resistance than the fine resolution resistors. If the physical size of the coarse resolution resistors can be the same as the physical size of the fine resolution resistors, then the architecture of DAC 10-1 greatly reduces the amount of integrated circuit area. For a 10 bit DAC with the new architecture shown in FIG. 2, the number of switches is greatly reduced and the decode logic is simplified.

However, DAC 10-1 does not reduce the number of string resistors if it is necessary to construct each of the resistors in coarse resolution resistor string 11 by connecting 32 precisely matched resistors of resistance R in order to achieve very precise matching of all of the string resistors in DAC 10-1. Often, it would be desirable to achieve the precise string resistor matching that is achieved by constructing each coarse resolution string resistor of resistance 32R in coarse resistor string 11 from 32 identical, and therefore precisely matched, series-connected individual resistors of resistance R, and by constructing each fine resolution string resistor of resistance R in fine resistor string 20 from one individual resistor of resistance R. In this case, the total number of required resistors is not reduced.

Also, the output impedance of DAC 10-1 of FIG. 2, varies considerably with respect to the value of the digital input code D0,1 . . . 9. This makes it difficult to achieve acceptable, consistent settling times for the voltages on sampling capacitors of switched capacitor sampling circuits which sample the DAC output voltages Vout1 and Vout2.

Nevertheless, in many cases, DAC 10-1 can be advantageously used in a switched capacitor circuit in which the differential voltage is transferred to switched capacitors, and then is transferred from there to another point in a system to be used for comparison, amplification, etc.

Figure 3:
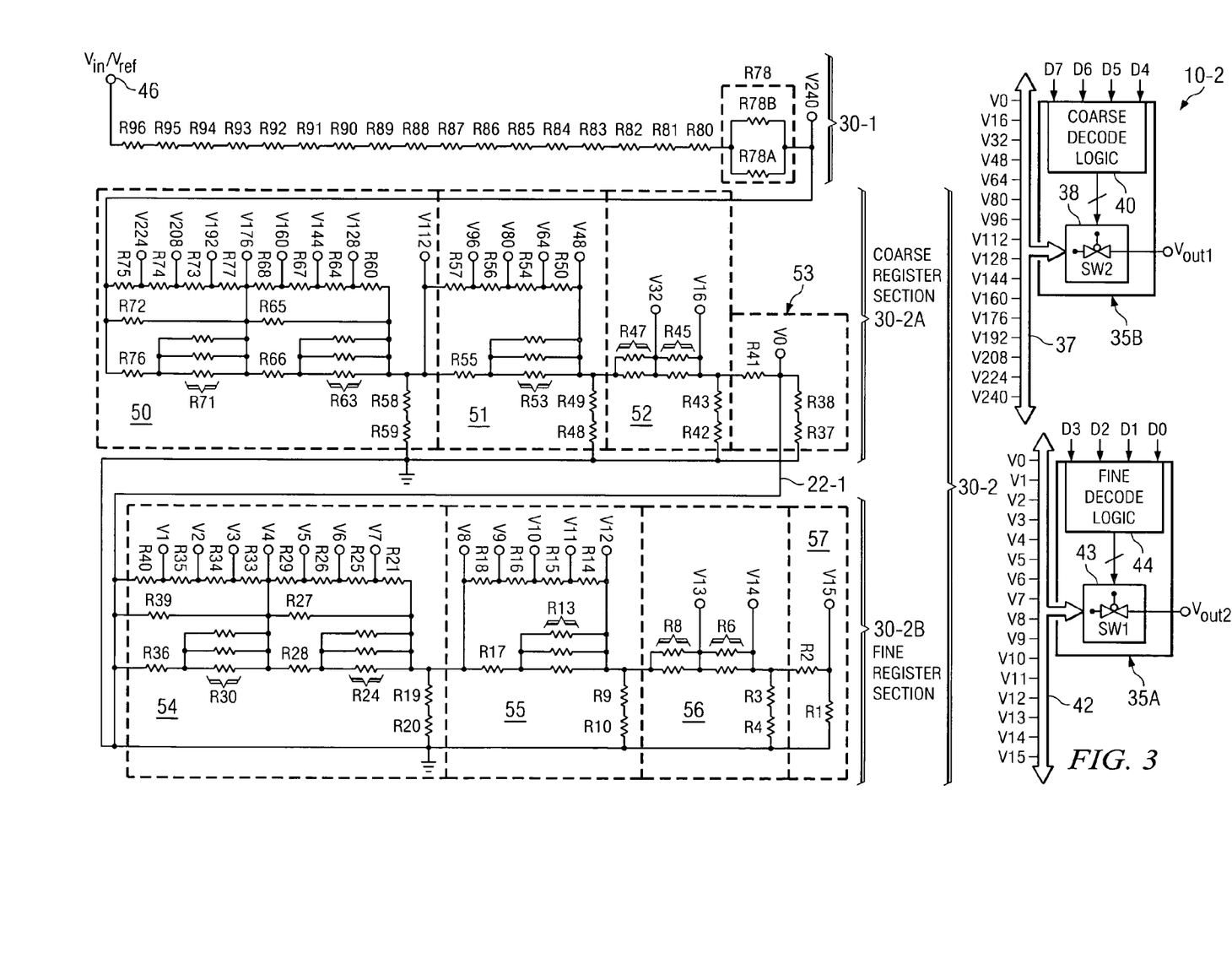
FIG. 3 is a schematic diagram of a preferred DAC architecture of the present invention.

FIG. 3 shows an 8-bit implementation of a presently preferred embodiment of the invention. In FIG. 3, an 8-bit implementation of DAC 10-2 of the present invention includes three distinct resistor sections 30-1, 30-2A and 30-2B. DAC 10-2 includes a coarse resolution resistor section 30-2A which provides coarse resolution node voltages V0, V16, V32 . . . and so forth, up to V240 (which are the exactly same coarse resolution node voltages that would be produced in an 8-bit implementation of string DAC 10-1 of FIG. 2), to be provided to 16 corresponding CMOS transmission gate switches SW2 in block 38 of coarse resolution decode and switch circuitry 35B. DAC 10-2 also includes a fine resolution resistor section 30-2B which provides fine resolution node voltages V0, B1, V2 . . . and so forth, up to V15, to be provided to the 16 corresponding CMOS transmission gate switches SW1 in block 43 of fine resolution decode and switch circuitry 35A.

DAC 10-2 also includes an optional resistor section 30-1, which can be constructed as a simple string resistor section including resistors R80, R81 . . . R96 and a composite resistor R78 (which is composed of two parallel-connected resistors R78A and R78B) all connected in series between input conductor 46 and conductor 240. An input voltage Vin or a reference voltage Vref can be applied to conductor 46, and a node voltage V240 is produced on conductor 240. Resistor section 30-1 can be omitted, and Vin/Vref can be coupled directly to conductor 240 if Vin or Vref is the needed voltage. However, if Vin or Vref needs to be scaled down, resistor section 30-1 can be included along with resistor sections 30-2A and 30-2B to provide voltage division to achieve the desired value of V240 on conductor 240. It should be appreciated that the scaling down of a particular supply voltage or reference voltage to obtain a voltage on conductor 240 that is scaled down with respect to the full scale voltage of the DAC may be quite desirable. It also should be appreciated that the scaling resistor section indicated by reference 30-1 works especially well with coarse resolution resistor section 30-2A and fine resolution resistor section 30-2B to provide the voltage division because the resistances of coarse resolution resistor section 30-2A and fine resolution resistor section 30-2B are not a function of the digital input code. Thus, a further advantage of the structure shown in FIG. 3 is that it not only provides a low, constant impedance independent of the digital input code, but also allows very convenient scaling of the voltage applied across the coarse and fine resistor sections down to a voltage that is scaled with respect to the full scale voltage of the DAC. (Of course, a resistor section similar to resistor section 30-1 also can be used in conjunction with DAC 10-1 of FIG. 2.)

Coarse resolution decode and switching circuit 35B decodes the most significant four bits D4,5 . . . 7 of eight-bit digital input word D0,1 . . . 7 to couple Vout1 to an appropriate one of the coarse resolution node voltages V0, V16, V32, V48 . . . V240 as shown in coarse resolution resistor section 30-2A. Fine resolution decode and switching circuit 35A decodes the least significant four bits D0,1 . . . 3 of eight-bit digital input word D0,1 . . . 7 to couple Vout2 to an appropriate one of the fine resolution node voltages V0,1,2 . . . 15 as shown in resistor section 30-2B. Each of the coarse resolution voltage steps of an 8-bit string DAC must be equal to 16 times each of the fine resolution voltage steps.

All of the integrated circuit resistors shown in FIG. 3 preferably are composed of identical resistors which are referred to herein as "resistive links", all of which have a resistance R, so that all of the resistors and combinations of resistors in an integrated circuit have a very high degree of matching.

Coarse resolution resistor section 30-2A and fine resolution resistor section 30-2B in FIG. 3 together form a modified R-2R network that provides all of the above mentioned node voltages needed to enable coarse resolution decode and switching circuit 35B and fine resolution decode and switching circuit 35A to produce the differential output signal Vout1−Vout2 in response to the decoding of digital input code D0,1 . . . 7 by coarse resolution decode logic 40 and fine resolution decode logic 44, with a resolution of 1 LSB.

Coarse resolution section 30-2A includes three R-2R sections 50, 51 and 52, and also includes a fourth R-2R section 53 which includes resistors R41 and R37,R38. Each R-2R section includes an "R" portion and a "2R" portion.

R-2R section 50 includes resistors R60, R63, R64, R65, R66, R67, R68, R71, R72, R76, R77, R73, R74, and R75 as its "R" portion (which has a resistance R), and also includes series-connected resistors R58 and R59 as its "2R" portion (which has a resistance 2×R). Similarly, R-2R section 51 includes resistors R50, R53, R54, R55, R56, and R57 as its "R" portion and includes resistors R48 and R49 as its "2R" portion. R-2R section 52 includes resistors R47 and R45 as its "R" portion and resistors R42 and R43 as its "2R" section.

Resistor R41 is the "R" portion of above mentioned R-2R section 53, which also includes series-connected resistors R37 and R38 as its "2R" portion.

Fine resolution resistor section 30-2B includes three R-2R sections 54, 55, and 56. R-2R section 54 includes resistors R24, R28, R21, R25, R26, R27, R29, R30, R36, R33, R34, R35, R39, and R40 as its "R" portion (which has a resistance R), and also includes series-connected resistors R20 and R19 as its "2R" portion (which has a resistance 2×R). Similarly, R-2R section 55 includes resistors R13, R14, R15, R16, R17, and R18 as its "R" portion and includes resistors R9 and R10 as its "2R" portion. R-2R section 56 includes resistors R6 and R8 as its "R" portion and resistors R3 and R4 as its "2R" section. Resistors R2 and R1 form the usual termination circuit of a R-2R network.

The "R" portion of R-2R section 50 includes resistor R75 connected between node voltages V240 and V224. Resistor R74 is connected between V224 and V208. Resistor R73 is connected between V208 and V192. Resistor R77 is connected between V192 and V176. Resistor R72 is connected between V240 and V176. Resistors R76 and R71 are connected in series between V240 and V176. Resistor R71 is composed of three resistors of resistance R connected in parallel. Similarly, resistor R68 is connected between V176 and V160. Resistor R67 is connected between V160 and V144. Resistor R64 is connected between V144 and V128. Resistor R60 is connected between V128 and V112. Resistor R65 is connected between V176 and V112. Resistors R66 and R63 are connected in series between V176 and V112. Resistor R63 is composed of three "resistive links", each of resistance R, connected in parallel.

The "R" portion of R-2R section 51 includes resistor R57 connected between V112 and V96. Resistor R56 is connected between V96 and V80. Resistor R54 is connected between V80 and V64. Resistor R50 is connected between V64 and V48. Resistors R55 and R53 are connected in series between V112 and V48. Resistor R53 is composed of three resistive links of resistance R connected in parallel.

The "R" portion of R-2R section 52 includes resistors R47 and R45 connected in series between V48 and V16. V32 is produced at the Junction between resistors R47 and R45. Resistors R47 and R45 each are composed of two resistive links of resistance R connected in parallel.

Similarly, the "R" portion of R-2R section 54 includes resistor R40 connected between V0 and V1. Resistor R35 is connected between V1 and V2. Resistor R34 is connected between V2 and V3. Resistor R33 is connected between V3 and V4. Resistor R39 is connected between V0 and V4. Resistors R36 and R30 are connected in series between V0 and V4. Resistor R30 is composed of three resistive links of resistance R connected in parallel. Similarly, resistor R29 is connected between V4 and V5. Resistor R26 is connected between V5 and V6. Resistor R25 is connected between V6 and V7. Resistor R21 is connected between V7 and V8. Resistor R27 is connected between V4 and V8. Resistors R28 and R24 are connected in series between V4 and V8. Resistor R24 is composed of three resistive links of resistance R connected in parallel.

The "R" portion of R-2R section 55 includes resistor R18 connected between V8 and V9. Resistor R16 is connected between V9 and V10. Resistor R15 is connected between V10 and V11. Resistor R14 is connected between V11 and V12. Resistors R17 and R13 are connected in series between V8 and V12. Resistor R13 is composed of three resistive links of resistance R connected in parallel.

The "R" portion of R-2R section 56 includes resistor R8 and R6 connected in series between V12 and V14. V13 is produced at the junction between resistors R8 and R6. Resistors R8 and R6 each are composed of two resistive links of resistance R connected in parallel.

All of the resistors shown in FIG. 3 preferably are identical, precisely matched resistive links of resistance R.

By way of definition, a coarse node voltage or a fine node voltage is considered to be "produced in" a R section of a R-2R section if the node voltage is produced either at the junction between the R and 2R sections of that R-2R section or if it is produced at any junction between resistive links of which the R section is composed.

DAC 10-2 of FIG. 3 solves the above mentioned problem of the implementation of FIG. 2 using "unitary" coarse resolution resistors of resistance 32R (rather than using coarse resolution resistors composed of 32 series-connected resistive links each of resistance R) and fine resolution resistors which each are a single resistive link of resistance R.

FIG. 3 achieves the reduction in the total number of required precisely matched resistors of resistance R (over the number required by the architecture of string DAC 10-1 of FIG. 2) by using the described R-2R network or equivalent thereof including coarse resolution resistive network 30-2A and fine resolution resistive network 30-2B so as to provide all of the reduced number of coarse resolution node voltages V0, V16, V32 . . . V240 and fine resolution node voltages V0, V1 . . . V15 that are needed (which are the same coarse resolution node voltages and fine resolution node voltages that would be required in an 8-bit implementation of DAC 10-1 in FIG. 2).

Also, the output impedance of 8-bit DAC 10-2 of FIG. 3 is much lower than the output impedance of an 8-bit implementation of string DAC 10-1 of FIG. 2. The range of the output impedance of DAC 10-2 is within a reasonably low range of approximately 1R and 3R, which is substantially lower than for the architecture of Prior Art FIG. 1. It should be noted that in a typical string DAC, the output impedance obviously depends heavily on which node voltage conductor is coupled to the string DAC output, and varies between approximately 0 and $(R \times 2^n)/4$, where n is the resolution of the DAC.

Thus, DAC 10-2 of FIG. 3 includes an R-2R resistor network instead of using conventional resistor strings, wherein the sections of the R-2R network are constructed of identical, and therefore precisely matched, integrated circuit resistors or resistive links of resistance R. The R-2R resistor network in FIG. 3 is formed of a much smaller number of identical integrated, precisely matched integrated circuit resistive links of resistance R than has been achieved in the prior art. For example, an 8-bit DAC with a differential output voltage range from 0 to 255 millivolts and an LSB or resolution of 1 millivolt (in which case the reference voltage Vref would be 2.496 volts) can be realized in the architecture of FIG. 3 using only 96 equal, precisely matched, inexpensive integrated circuit resistors.

The "R" sections are modified in order to obtain the number of node voltages required for the resolution determined by the number of bits of the digital input code D0,1 . . . 7. It should be appreciated that the "splitting" of the "R" sections to achieve needed number of node voltages can be accomplished in various ways. The particular way disclosed herein represents a compromise between the number of identical resistors of resistance R needed and the desired output impedance of the DAC.

Although a single ended output may be desirable for a stand alone DAC, in many cases a differential output is preferable, especially for a DAC embedded in a larger integrated circuit system. For example, if the DAC outputs must be sampled by means of switched capacitor circuitry, the differential output of FIG. 3 is preferable because it provides better balanced charging and settling of the sampling capacitors of the switched capacitor circuitry.

To summarize, the new topology of FIG. 2 greatly reduces the number of switches and simplifies the digital decode logic. The new topology of FIG. 3 including the "R-2R" embodiment of the DAC solves the problem of high, widely varying output impedance. If the differential output voltage is sampled, the settling time for the sampling is minimal and does not vary significantly with the DAC input code. The topology of FIG. 3 allows the entire DAC to be implemented with a relatively very small number of equal, precisely matched resistors, and additionally reduces the number of components and the amount of integrated circuit chip area. The use of the equal, precisely matched resistors reduces the DNL and INL (integral nonlinearity) errors of the DAC.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although DAC 10-1 of FIG. 2 and DAC 10-2 of FIG. 3 show the same number of digital input bits applied to the coarse resolution sections and the fine resolution sections, it is not necessary that the same number of the digital input bits be applied to the coarse resolution and fine resolution sections. Furthermore, the embodiment of FIG. 3 could be modified so as to use fine string resistors 20 of FIG. 2 instead of R-2R network 30-2B.

What is claimed is:

1. An n-bit digital to analog converter (DAC) for converting a digital input signal to an analog output signal, the DAC comprising:
   a first voltage divider coupled between a first input voltage and an intermediate voltage having a plurality of first nodes, wherein the first voltage divider includes a plurality of R-2R sections coupled to one another;
   a first switching circuit coupled to each first node and coupled to a first output node, wherein the first switching circuit includes a plurality of first selection lines;
   first decoder for decoding at least a first portion of the digital input signal, wherein the first decoder applies selection signals to the first selection lines of the first switching circuit;
   a second voltage divider coupled between the intermediate voltage and a second input voltage having a plurality of second nodes, wherein the second voltage divider includes a plurality of R-2R sections coupled to one another;
   a second switching circuit coupled to each second node and coupled to a second output node, wherein the second switching circuit includes a plurality of first selection lines; and
   a second decoder for decoding at least a portion of the digital input signal, wherein the second decoder applies selection signals to the second selection lines of the second switching circuit to produce the analog output signal between the second and first output nodes.

2. The DAC of claim 1 wherein each first node is separate from its adjacent first nodes by a first voltage increment and wherein each second node is separated from its adjacent second nodes by a second voltage increment.

3. The DAC of claim 2 wherein the first voltage increment is equal to $2^{n/2}$ times the second voltage increment.

4. The DAC of claim 1 wherein the plurality of R-2R sections further comprises a plurality of sequentially connected R-2R sections all composed of identical resistive links each having a predetermined resistance.

5. The DAC of claim 4 wherein the second voltage divider further comprises: a plurality of sequentially connected R-2R sections all composed of identical resistive links each having the predetermined resistance and a termination circuit including a R section.

6. The DAC of claim 5 wherein the resistive links in the plurality of sequentially connected R-2R sections of the second voltage divider are configured substantially similarly to the resistive links in the plurality of sequentially connected R-2R sections of the first voltage divider.

7. The DAC of claim 5 wherein the first voltage divider further comprises a reference voltage and a scaling resistor that produces the first input voltage.

8. The DAC of claim 4, wherein each R-2R section further comprises a R section and a 2R section, wherein each first node extends from at least one of the R sections.

9. The DAC of claim 4 wherein each R-2R section further comprises a R section and a 2R section, wherein each successive R section has twice the number of first nodes than the previous R section.

10. An n-bit DAC that converts a digital signal to an analog signal, the DAC comprising:
    a plurality of resistor networks coupled to one another between a first and a second voltage, wherein each resistor network has a plurality of nodes, and wherein at least one of the resistor networks includes a plurality of R-2R sections coupled to one another in a sequence with each successive R-2R section having twice the number of nodes than the previous R-2R section;
    a switching network coupled to each node of the plurality of resistor networks and coupled to a plurality of output nodes; and
    a decoder network that decodes at least a portion of the digital signal for each resistor network and that provides at least one selection signal to the switching network to produce the analog signal between at least two of the output nodes.

11. The DAC of claim 10 wherein each node of a first resistor network is separate from its adjacent first nodes by a first voltage increment and wherein each node of a second resistor network is separated from its adjacent second nodes by a second voltage increment.

12. The DAC of claim 11 wherein the first voltage increment is equal to $2^{n/2}$ times the second voltage increment.

13. The DAC of claim 10 wherein each resistor network includes a plurality of R-2R sections.

14. The DAC of claim 10, wherein the plurality of resistor networks further comprises a pair of resistor networks.

15. The DAC of claim 14, wherein the switching network further comprises a pair of switching circuits, wherein each switching circuit includes a plurality of switches.

16. The DAC of claim 14, wherein the decoder network further comprises a pair of decoders, wherein one of the decoders decodes at least a portion of the most significant bits of the digital signal and the other decoder decodes at least a portion of the least significant bits of the digital signal.

17. A method for converting a digital signal to an analog signal, the method comprising:
    inputting a reference voltage into a plurality of R-2R sections arranged in a sequence, wherein each successive R-2R section has twice the number of nodes than the previous R-2R section;
    outputting a voltage at each node, wherein the voltage at each node is separate from its adjacent nodes by a voltage increment;
    decoding at least a portion of the digital signal;
    actuating a switching network to couple at least one of the nodes to an output node based on the decoding of at least a portion of the digital signal; and
    deriving the analog signal at least partially from the output node.

18. The method of claim 17, wherein the method further comprises:
    inputting an intermediate voltage into a second plurality of R-2R sections arranged in a sequence, wherein each successive R-2R section of the second plurality of R-2R sections has twice the number of second nodes than the previous R-2R section of the second plurality of R-2R sections;
    outputting a voltage at each second node, wherein the voltage at each second node is separate from its adjacent second nodes by a second voltage increment;
    decoding at least a second portion of the digital signal;
    actuating the switching network to couple at least one of the second nodes to a second output node based on the decoding of at least the second portion of the digital signal;
    deriving the analog signal at least partially from the second output node.

* * * * *